US008338220B2

(12) United States Patent
Borden et al.

(10) Patent No.: US 8,338,220 B2
(45) Date of Patent: Dec. 25, 2012

(54) NEGATIVELY CHARGED PASSIVATION LAYER IN A PHOTOVOLTAIC CELL

(75) Inventors: Peter G. Borden, San Mateo, CA (US); Christopher Sean Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 680 days.

(21) Appl. No.: 12/367,064

(22) Filed: Feb. 6, 2009

(65) Prior Publication Data
US 2010/0203742 A1 Aug. 12, 2010

(51) Int. Cl.
*H01L 21/00* (2006.01)
*H01L 21/31* (2006.01)
*H01L 21/469* (2006.01)

(52) U.S. Cl. .................... 438/83; 438/787; 257/E23.132

(58) Field of Classification Search .................... 438/38, 438/71, 72, 783, 787, 958, 83; 257/E23.132
See application file for complete search history.

(56) References Cited

U.S. PATENT DOCUMENTS

| 3,917,491 A * | 11/1975 | Oswald et al. ................. 438/474 |
| 4,197,141 A | 4/1980 | Bozler et al. |
| 4,774,196 A * | 9/1988 | Blanchard ..................... 438/455 |
| 5,010,040 A | 4/1991 | Vayman |
| 5,030,295 A | 7/1991 | Swanson et al. |
| 5,968,379 A | 10/1999 | Zhao et al. |
| 6,147,297 A * | 11/2000 | Wettling et al. ................ 136/256 |
| 6,335,535 B1 * | 1/2002 | Miyake et al. ............. 250/492.21 |
| 6,909,087 B2 * | 6/2005 | Ichiki et al. .................... 250/251 |
| 7,004,107 B1 | 2/2006 | Raoux et al. |
| 7,091,138 B2 | 8/2006 | Numasawa et al. |
| 7,375,378 B2 | 5/2008 | Manivannan et al. |
| 7,381,595 B2 | 6/2008 | Joshi et al. |
| 2005/0022863 A1 * | 2/2005 | Agostinelli et al. ........... 136/256 |
| 2006/0081558 A1 | 4/2006 | Collins et al. |
| 2006/0154432 A1 * | 7/2006 | Arai et al. ..................... 438/385 |
| 2007/0111546 A1 | 5/2007 | Iyer et al. |
| 2007/0148336 A1 | 6/2007 | Bachrach et al. |

FOREIGN PATENT DOCUMENTS

| JP | 07-106612 | 4/1995 |
| JP | 08-037316 | 2/1996 |
| JP | 10-070297 | 3/1998 |

OTHER PUBLICATIONS

"In situ steam generation: A new rapid thermal oxidation technique", *Solid State Technology: The International Magazine for Semiconductor Manufacturing*, 11 pgs., vol. 43 Issue 7, Jul. 2000.
"Beyond the 100 nm node: Single-wafer RTP", *Solid State Technology: The International Magazine for Semiconductor Manufacturing*, 4 pgs., vol. 46, Issue 5, May 2003.
International Search Report and Written Opinion in PCT/US2010/023311, mailed Sep. 28, 2010, 9 pgs.

* cited by examiner

*Primary Examiner* — Matthew Landau
*Assistant Examiner* — Daniel Luke
(74) *Attorney, Agent, or Firm* — Diehl Servilla LLC

(57) ABSTRACT

Embodiments of the invention are directed to methods and apparatus for processing of a solar substrate for making a photovoltaic device. In particular, methods and apparatus for creating a negatively charged passivation layer by are provided.

17 Claims, 4 Drawing Sheets

NEGATIVELY CHARGED PASSIVATION LAYER IN A PHOTOVOLTAIC CELL

TECHNICAL FIELD

Embodiments of the present invention generally relate to photovoltaic devices and fabrication of photovoltaic devices. In particular, embodiments of the invention relate to negatively charged passivation layers and creation thereof in photovoltaic cells.

BACKGROUND

Photovoltaic (PV) or solar cells are material junction devices which convert radiation into direct current (DC) electrical power. When exposed to sunlight (consisting of energy from photons), the electric field of solar cell p-n junctions separates pairs of free electrons and holes, thus generating a photo-voltage. A circuit from n-side to p-side allows the flow of electrons when the solar cell is connected to an electrical load, while the area and other parameters of the PV cell junction device determine the available current. Electrical power is the product of the voltage times the current generated as the electrons and holes are separated by a current collecting junction.

A cross-sectional diagram of a known semiconductor based solar cell 100 is shown in FIG. 1. The solar cell has a top grid 101 that serves as the top electrode, an anti-reflection layer 102, an n-type layer 103, a p-type bulk 104, point contacts 105 connected to a back metal layer 107 that serves as the back electrode and a dielectric layer 106.

Power is generated by an external current between top electrode and back electrode which is sustained by charge carriers being released from the cell by radiation. In order to obtain high efficiency with silicon solar cells, it is necessary to reduce carrier recombination at the front and back surfaces. This is usually done with a process called passivation. When the solar cell absorbs a photon an electron-hole pair is created. If these carriers recombine before they are collected at a semiconducting junction, they are lost and cannot contribute to the cell's current. Because surfaces present a discontinuity with a high density of dangling bonds, they are primary sites for recombination. The problem is made worse in advanced cell designs that have long lifetime substrates where there is a high probability that carriers will reach a surface before they reach a junction.

An attractive method to passivate the surface is to deposit an insulator layer also called a passivation layer on the body of the cell. Most commonly, $Si_3N_4$ or $SiO_2$ are used as passivation layer material. $SiO_2$ has as an attractive property that it forms an interface with a minimum number of dangling bonds. However, it has a low index of refraction that is unsuitable to form an anti-reflection coating. $Si_3N_4$ does not form as good an interface with a low number of dangling bonds. However, it has an index of refraction near the ideal value for use with silicon.

With either material, it is possible to add charge to a passivation layer. Nitride forms with a net positive charge using CVD or PVD. Silicon dioxide also forms with a net positive fixed charge. On p-type material, the positive charge inverts the surface, creating a layer of electrons (minority carriers) and an absence of holes (majority carriers). The traps will charge with electrons, but there are no holes to discharge them, thereby neutralizing them.

In certain cell designs, such as the PERL or PERC cells, or laser fired back contact cells, it is desirable to impart a negative charge to the passivation layer. These are point contact cells, as for instance shown in FIG. 1, which have back contacts in the form of small localized regions, with the remaining back area covered with a passivation layer. These contacts form a CMOS structure that will drain off an inversion layer. Because of the long lifetime in the substrate, the minority carrier generation rate is too low, and the inversion layer cannot form. An accumulation layer is preferred because it contains readily available majority carriers, and can therefore respond much more rapidly. A negative charge is required to form an accumulation layer in p-type material.

Negative charge, however, is not compatible with a traditional solar cell process. Such a process uses hydrogen to passivate defects in the bulk and at the interface between the passivation layer and the semiconductor. Hydrogen has a positive charge, and will neutralize negative charge within the passivation layer. In many cases, the passivation layer is formed with an excess of hydrogen to act as a source for hydrogen passivation. This further complicates realizing a net negative charge in the passivation layer.

Therefore, there is a need for a negative charged passivation layer. It would also be desirable to provide such a negatively charged layer while still maintaining the availability of hydrogen for passivation and for a process to form such a negative charged passivation layer.

SUMMARY

One embodiment of the invention pertains to a method of forming a layer on a surface of a solar cell substrate in a process chamber, comprising placing a solar cell substrate having a textured silicon surface in the process chamber; forming an oxide layer on the substrate having an oxide layer depth; providing negative ions formed from a negative ion source in the process chamber; and implanting the negative ions in the oxide layer to form a negatively charged passivation dielectric layer on the solar cell substrate.

In an embodiment, the negative ions are oxygen ions and the passivation layer comprises a silicon dioxide layer. In an embodiment, the method further comprises biasing the chamber by applying power to a counter electrode within the chamber and a substrate support supporting the substrate to provide a bias electric field.

Various embodiments may involve varying power from the power source to alternate the bias electric field between a first field strength with a first field direction and a second field strength with a second field direction. In one embodiment, the method includes supplying a source of positive ions into the chamber. In one embodiment, the first field strength with the first field direction implants the negative ions to a first depth in the layer and the second field strength with the second field direction implants the positive ions to a second depth in the layer.

The power according to an embodiment is varied in the range of about 30 and 300 volts between counter electrode and substrate. In a specific embodiment, the power is varied in the range of about 100 and 200 volts between counter electrode and substrate. In a specific embodiment, the bias electric field is provided after growing an initial oxide layer on the substrate.

In certain embodiments, the initial oxide layer is grown to a depth of at least about 20 Angstroms prior to providing the bias electric field. Embodiments may include introducing a third ion source into the chamber, for example, aluminum or hafnium.

In some embodiments, the counter electrode comprises a gas distribution plate, and the gas distribution plate is in communication is an oxygen source and a hydrogen source. In other embodiments, the counter electrode comprises a grid located adjacent the substrate support in the chamber.

In one embodiment, a method of forming a passivation layer on a surface of a solar cell substrate comprises placing a solar cell substrate having a textured silicon surface in the process chamber; forming an oxide layer on the substrate having an oxide layer depth; supplying oxygen and hydrogen into the chamber; and applying an asymmetric AC bias between a counter electrode and the substrate in the chamber, the bias varying between a positive bias and a negative bias, the positive bias having a magnitude greater than the negative bias such that hydrogen ions are implanted into the substrate beneath the depth of the oxide layer and the oxygen ions are implanted into the oxide layer but not into the substrate to provide a negatively charged passivation layer.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the singular forms "a", "an" and "the" include plural referents unless the context clearly indicates otherwise.

Applied Materials, Inc. of Santa Clara, Calif. offers a substrate processing chamber which includes a process called RadOx® to form thin silicon dioxide layers for CMOS transistor gates. The RadOx® process heats the substrate with lamps and injects hydrogen and oxygen into a process chamber. These gases form radicals when they strike the surface of the substrate. The radicals are more reactive than neutral species, providing a faster layer growth rate than would be available with steam processes known as In Situ Steam Generated (ISSG) oxide growth.

Figure 1:
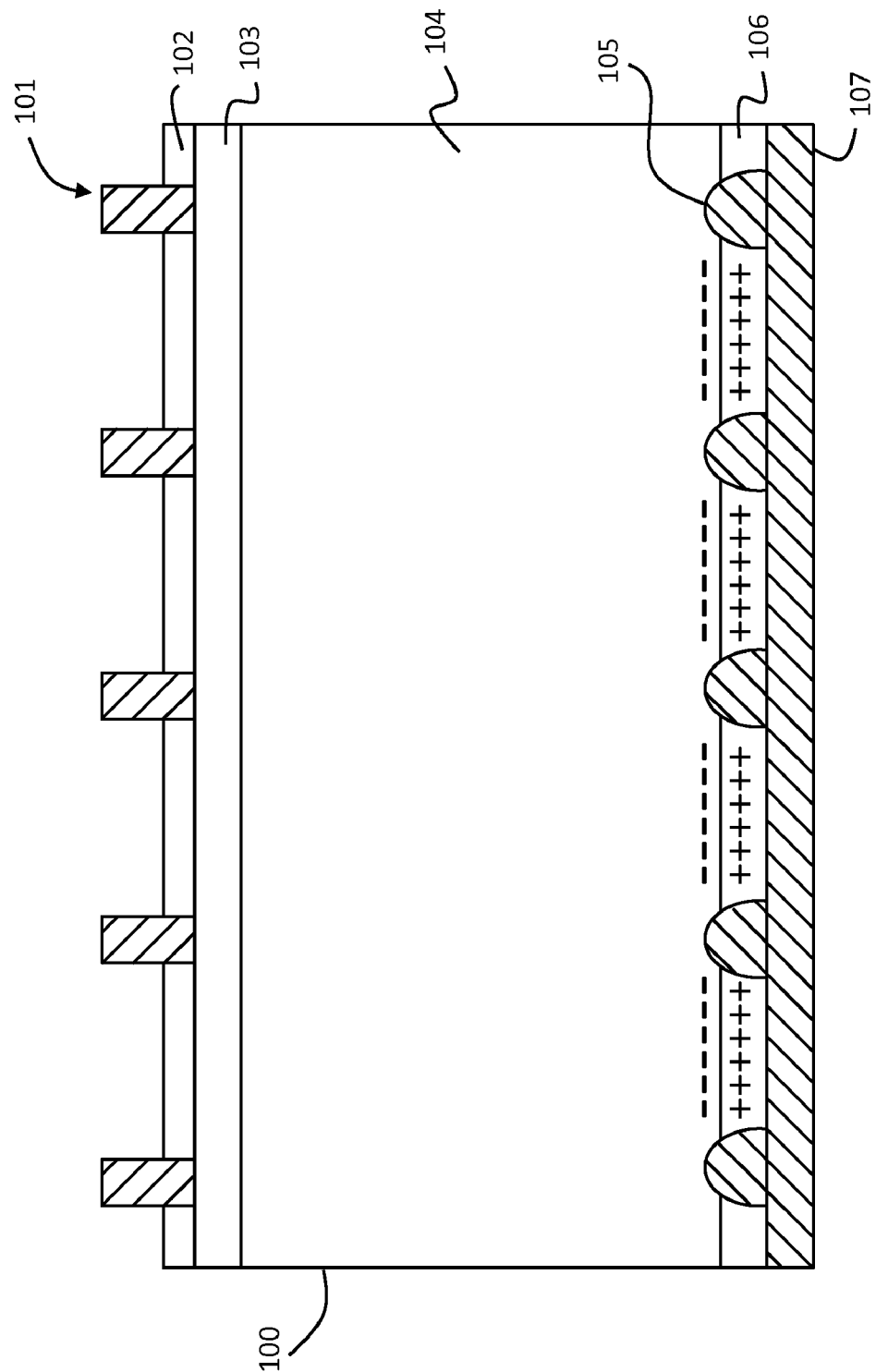
FIG. 1 schematically illustrates a photovoltaic device.
Figure 2:
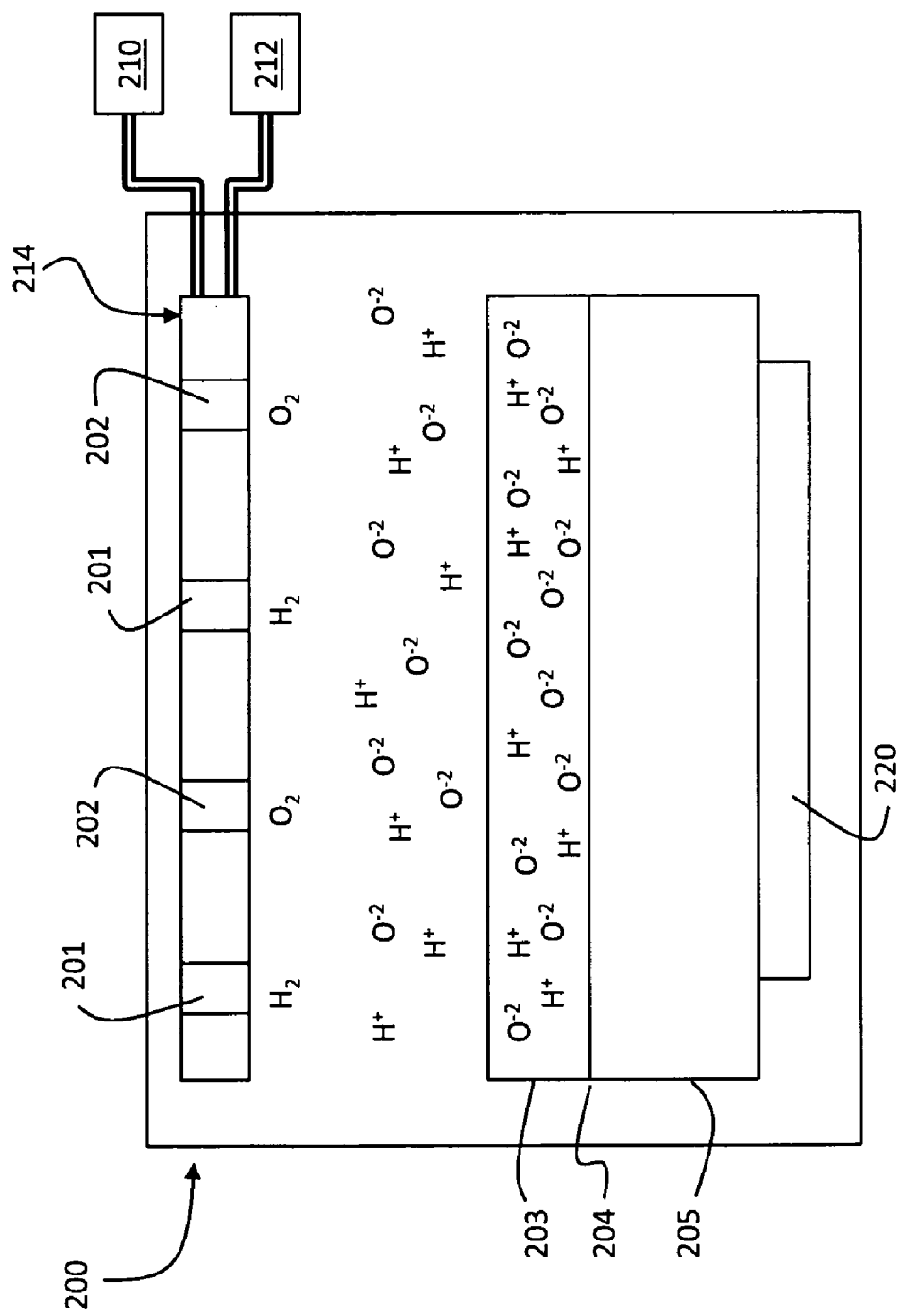
FIG. 2 schematically illustrates the growing of an oxide layer on a substrate.

A schematic diagram illustrating the RadOx® process is shown in FIG. 2. Hydrogen and oxygen gases are injected into chamber 200 from sources 210 and 212. In the embodiment shown in FIG. 2, the gases are delivered into the chamber through a gas distribution plate 214, which has a plurality of channels, and hydrogen outlet ports 201 in fluid communication with the hydrogen supply 210 and oxygen outlet ports 202 in fluid communication with the oxygen supply 212. The gases, which are ion sources, can be ionized in the chamber and form radicals at the surface of substrate 205 placed in the chamber 200 on substrate support 220. The radicals react to form the silicon dioxide layer 203. Note that upon quenching of the growth, a net concentration of radicals will exist within the layer 203. However, the layer 203 as grown may not appear to have a net negative charge. This is likely because oxygen is consumed at the interface 204 to grow the layer 203 but hydrogen is not. Consequently, the layer 203 is hydrogen rich, but without a net negative charge as is desired.

Figure 3:
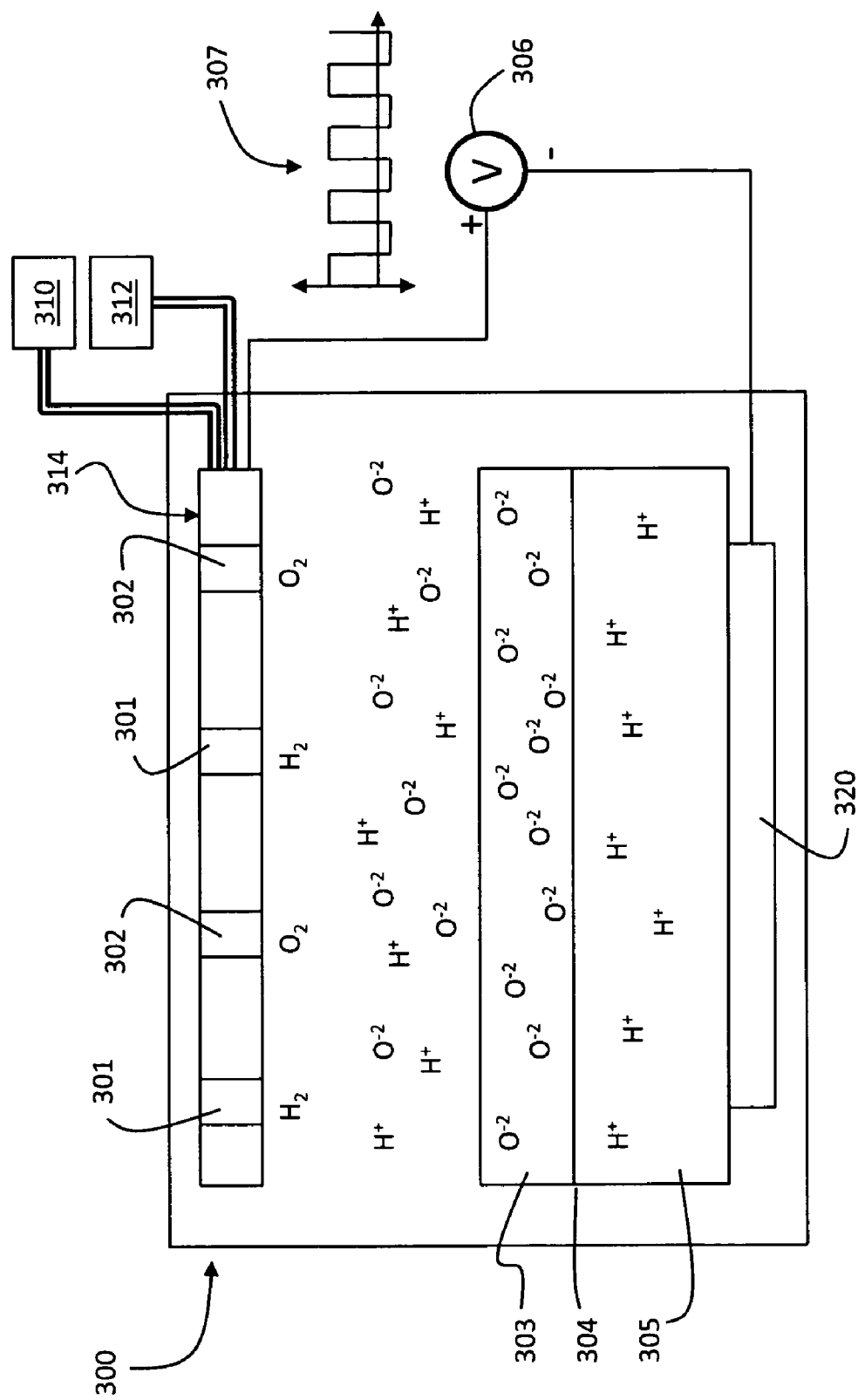
FIG. 3 schematically illustrates the growing on a solar cell substrate an oxide layer that may act as a passivation layer by using ion implantation.

In accordance with an aspect of the present invention, a method is provided for implanting ions into a passivation layer. In an embodiment of the invention, a bias electric field is applied to the processing chamber as shown in FIG. 3. FIG. 3 schematically illustrates the principle of biased deposition of radicals formed by the ionization of the gases entering the process chamber. Hydrogen and oxygen gases are injected into chamber 300 from hydrogen source 310 and oxygen source 312. The gases are delivered into the chamber through a gas distribution plate 314, which has a plurality of channels, and hydrogen outlet ports 301 in fluid communication with the hydrogen source 310 and oxygen outlet ports 302 in fluid communication with the oxygen source 312. In alternative embodiments, the gases can be delivered into the chamber directly without a distribution plate. In one embodiment, after an initial layer is formed using a radical oxidation process as described above with respect to FIG. 2, the gases, which are ion sources, are then ionized in the process chamber 300 when power is applied to the power source 306 to provide a bias in the chamber 300. Thus, a silicon dioxide layer 303 is formed by radical oxidation at the surface of substrate 305 placed in the chamber 300 on substrate support 320. Power source 306 is connected through a capacitive coupling circuit (not shown) to the substrate support 320, at least a portion of which is conductive and acts as an electrode. The radicals react to form the silicon dioxide layer 303 to provide interface 304. The oxygen gas provides negative ions in the process chamber, and the hydrogen gas provides positive ions in the process chamber. In one embodiment, substrate 305 is a solar cell substrate used in the manufacture of photovoltaic devices, and a method of forming a passivation layer on a solar cell substrate 305 is provided. Solar cell substrates 305, which are typically bulk silicon or polycrystalline silicon, have a textured surface formed by etching of the surface. The textured surface is allows light trapping in photovoltaic cells made from solar cell substrates.

In one embodiment, the chamber is biased without the formation of the initial oxide layer, and the oxide layer 303 is formed upon biasing the chamber 300. As noted above, in one embodiment, the thin initial layer 303 is grown without applying a bias. This initial layer 303 can be about 20 Å thick, and may prevent damage to the surface at interface 304 from the impact of ions accelerated under bias of an electric field created by the power source 306, which may be a radio frequency (RF) alternating current (AC) power source. As noted above, the power source 306 is coupled to the substrate support 320, and the gas distribution plate 314, which functions as a counter electrode.

In one embodiment a pulsed voltage bias is used, although other embodiments may use a DC voltage bias. As will be understood by those skilled in the art, the gas distribution plate 314 would be negatively biased with respect to the substrate 305 to implant negative ions into the layer 303. This bias would be reversed to implant positive ions. Alternating the bias electric field between a first field strength with a first field direction and a second field strength with a second field direction allows implantation of positive and negative ions into the layer 303. By applying power with source of positive ions in the chamber to bias at a first field strength and a first field direction allows implantation of the negative ions to a first depth of the substrate. Varying bias to provide a second field strength and a second field direction, the positive ions can be implanted to implant the different ions at different depths.

In general, a pulsed bias offers the advantage of AC coupling to the back of the substrate 305, making electrical coupling easier. In a specific embodiment, the AC bias is not symmetric (asymmetric) as is shown in graph 307 of FIG. 3. Frequencies in the range of about 200-300 KHz can be used in accordance with embodiments of the invention. It will be appreciated that higher frequencies will facilitate capacitive coupling to the back of the substrate 305. According to one embodiment, the duration of each pulse applied can be a 50% duty cycle, and the voltage applied can be relatively low, for example in the range of about 100-200V. The invention is not limited to a particular power range, and the power applied can be varied across a wide range, for example to result in ion acceleration voltages in the less than 300 V. In general, the ion energy should be sufficient to implant negative ions such as oxygen into the layer 303, but not into the substrate 305, and will depend on the ion and layer 303 thickness. This can be calculated using computer programs like SRIM. The magnitude of the negative voltage of a pulse is small compared to the magnitude of the positive voltage of a pulse. This difference ensures that the negative oxygen ions are implanted into the layer 303, but not into the substrate 305. Conversely, the hydrogen is implanted into the substrate, past the depth of the layer 303. Because hydrogen is light, it will not cause damage. The heavier oxygen could cause damage, and may therefore be implanted into the layer 303, and not the substrate 305. This separation of the hydrogen and oxygen reduces the ability of the hydrogen to neutralize the oxygen; the hydrogen is now in the bulk of substrate 305, not in the layer 303.

The duration of the process generally will be equal to the desired dose divided by the dose rate. For example, if the desired charge is $10^{13}$ ions/cm$^2$, and the ion arrival rate (dose rate) is $10^{12}$/cm$^2$/sec, then the duration is 10 seconds, According to one or more embodiments, the oxide layer 303 is on the order of about 40-200 Å thick, and the ion energy would be chosen so that the peak concentration would be in the upper half of the layer 303 to minimize damage to the silicon.

Figure 4:
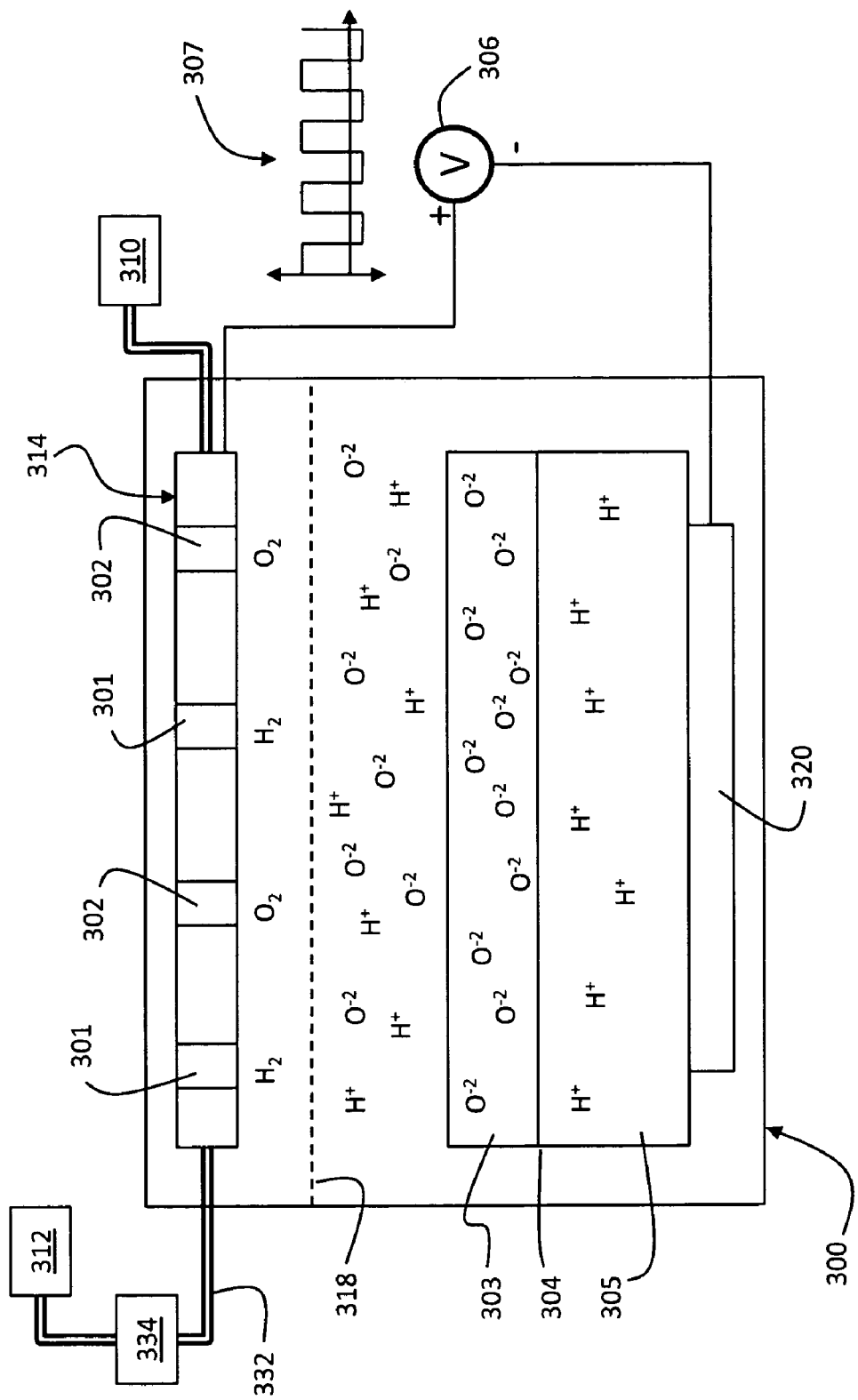
FIG. 4 schematically illustrates an alternative embodiment for growing on a solar cell substrate an oxide layer that may act as a passivation layer by using ion implantation.

FIG. 4 shows an alternative embodiment for processing a substrate 305. In FIG. 4, the chamber is substantially similar to the chamber shown in FIG. 3, except that instead of biasing a gas distribution plate, a wire grid 318 is placed above the substrate to establish a bias. In addition, oxygen source 312 is coupled to a gas line 332 that includes a remote ionizer 334 for ionizing the oxygen gas 302. The wire grid 318 above the wafer provides a counter electrode that is adapted to accelerate ions to the substrate. The grid mesh could be 1-2 mm, and could be spaced on the order of 1-2 cm above the wafer. If the grid is included in the growth chamber as shown in FIG. 4, it should be made of tungsten or some metal that can tolerate the heat lamp flux to the wafer, as the wafer might be heated to grow the oxide. An alternate approach would be a second chamber that is used to inject the radicals into the layer 303 after it is grown, so that one chamber is just a growth chamber with heat lamps, and the second is a charging chamber with just an ion injector and acceleration grid.

In another embodiment, additional or different ions may be implanted for passivation purposes. For example, aluminum or hafnium may be implanted into the layer 303. Aluminum is a p-type dopant in silicon and thought to form a negatively charged specie in the oxide. Other ions might have different range in the oxide to enhance the separation from the hydrogen, or to enable implants into thinner oxides.

While there have been shown, described and pointed out fundamental novel features of the invention as applied to embodiments thereof, it will be understood that various omissions and substitutions and changes in the form and details of the methods, devices and systems illustrated and in their operation may be made by those skilled in the art without departing from the spirit of the invention. It is the intention, therefore, to be limited only as indicated by the scope of the claims appended hereto.

The invention claimed is:

1. A method of forming a layer on a surface of a solar cell substrate in a process chamber, comprising:
    placing a solar cell substrate having a textured silicon surface in the process chamber;
    forming an oxide layer on the substrate having an oxide layer depth;
    providing negative ions formed from a negative ion source in the process chamber;
    supplying a source of positive ions into the chamber;
    biasing the chamber to provide a bias electric field;
    varying power to alternate the bias electric field between a first field strength with a first field direction and a second field strength with a second field direction, wherein the first field strength with the first field direction implants the negative ions to a first depth in the oxide layer to form a negatively charged passivation dielectric layer on the solar cell substrate, and the second field strength with the second field direction implants the positive ions to a second depth in the oxide layer.

2. The method of claim 1, wherein the negative ions are oxygen ions and the passivation layer comprises a silicon dioxide layer.

3. The method of claim 1, wherein biasing the chamber includes applying power to a counter electrode within the chamber and a substrate support supporting the substrate to provide the bias electric field.

4. The method of claim 3, the power is varied in the range of about 30 and 300 volts between counter electrode and substrate.

5. The method of claim 4, wherein the power is varied in the range of about 100 and 200 volts between counter electrode and substrate.

6. The method of claim 3, further comprising providing the bias electric field after growing an initial oxide layer on the substrate.

7. The method of claim 6, wherein the initial oxide layer is grown to a depth of at least about 20 Angstroms prior to providing the bias electric field.

8. The method of claim 3, further comprising introducing a separate ion source into the chamber.

9. The method of claim 8, wherein the separate ion source provides aluminum ions.

10. The method of claim 8, wherein the separate ion source provides hafnium ions.

11. The method of claim 3, wherein the counter electrode comprises a gas distribution plate, and the gas distribution plate is in communication with an oxygen source and a hydrogen source.

12. The method of claim 3, wherein the counter electrode comprises a grid located adjacent the substrate support in the chamber.

13. A method of forming a passivation layer on a surface of a solar cell substrate comprising:
    placing a solar cell substrate having a textured silicon surface in the process chamber;
    forming an oxide layer on the substrate having an oxide layer depth;
    supplying oxygen and hydrogen into the chamber; and
    applying an asymmetric AC bias between a counter electrode and the substrate in the chamber, the bias varying between a positive bias and a negative bias, the positive bias having a magnitude greater than the negative bias such that hydrogen ions are implanted into the substrate beneath the depth of the oxide layer and the oxygen ions are implanted into the oxide layer but not into the substrate to provide a negatively charged passivation layer.

14. The method of claim 13, wherein the oxide layer is grown to a depth of at least about 20 Angstroms prior to applying the bias.

15. The method of claim 13, further comprising introducing a separate ion source into the chamber.

16. The method of claim 15, wherein the separate ion source comprises hafnium.

17. The method of claim 15, wherein the separate ion source comprises aluminum.

* * * * *